US010529870B1

(12) United States Patent
Han et al.

(10) Patent No.: US 10,529,870 B1
(45) Date of Patent: Jan. 7, 2020

(54) LIGHT TRAPPING IN HOT-ELECTRON-BASED INFRARED PHOTODETECTORS

(71) Applicants: Sang Eon Han, Albuquerque, NM (US); Seok Jun Han, Albuquerque, NM (US)

(72) Inventors: Sang Eon Han, Albuquerque, NM (US); Seok Jun Han, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 65 days.

(21) Appl. No.: 15/693,115

(22) Filed: Aug. 31, 2017

Related U.S. Application Data

(60) Provisional application No. 62/413,382, filed on Oct. 26, 2016.

(51) Int. Cl.
| | |
|---|---|
| *H01L 31/0216* | (2014.01) |
| *G01J 1/42* | (2006.01) |
| *H01L 31/0232* | (2014.01) |
| *H01L 31/028* | (2006.01) |
| *H01L 31/0236* | (2006.01) |
| *H01L 31/108* | (2006.01) |
| *H01L 31/18* | (2006.01) |

(52) U.S. Cl.
CPC ......... *H01L 31/02164* (2013.01); *G01J 1/42* (2013.01); *H01L 31/028* (2013.01); *H01L 31/02161* (2013.01); *H01L 31/02327* (2013.01); *H01L 31/02363* (2013.01); *H01L 31/108* (2013.01); *H01L 31/1804* (2013.01)

(58) Field of Classification Search
CPC ......... H01L 31/02164; H01L 31/02161; H01L 31/02327; H01L 31/02363; H01L 31/028; H01L 31/108; H01L 31/1804; G01J 1/42
See application file for complete search history.

(56) References Cited

U.S. PATENT DOCUMENTS

2015/0340521 A1* 11/2015 Kempa ............ H01L 31/02168 136/256

OTHER PUBLICATIONS

Tao et al; Low Schottky barriers on n-type silicon (001), App. Phys. Lett., 83, 2593-2595 (2003); 4 pages; American Institute of Physics; US.
Singh; Semiconductor Devices: Basic Principles, John Wiley & Sons, Inc.; 15 pages, (2001).
Park et al; Fabrication of smooth patterned structures of refactory metals, semiconductors, and oxides via template stripping, App;. Mater. Interferences, 5, 9701-9708 (2013); 8 pages; American Chemical Society; ACS Publications; US.
Li et al; Metamaterial perfect absorber based hot electron photodetection, Nano Lett., 14, 3510-3514 (2014); 5 pages; American Chemical Society; ACS Publications; US.
Lin et a; Silicon-based broadband antenna for high responsivity and polarization-insensitive photodetection at telecommunication wavelengths, Nat. Commun., 5, 3288 (Feb. 11, 2014); 10 pages; Macmillan Publishers Limited; US.

* cited by examiner

*Primary Examiner* — Christine S. Kim
(74) *Attorney, Agent, or Firm* — Keith Vogt, Ltd.; Keith A. Vogt

(57) ABSTRACT

A photonic infrared detector having at least one metal layer having a broad-band IR absorption and the detector is configured to enable light to make a plurality of passes within a c-Si substrate.

16 Claims, 3 Drawing Sheets

LIGHT TRAPPING IN HOT-ELECTRON-BASED INFRARED PHOTODETECTORS

RELATED APPLICATIONS

This application claims the benefit of U.S. Provisional Application No. 62/413,382 filed Oct. 16, 2016, and herein incorporated by reference.

STATEMENT REGARDING FEDERALLY SPONSORED RESEARCH & DEVELOPMENT

This invention was made with government support under DMR1555290 awarded by the National Science Foundation. The government has certain rights in the invention.

INCORPORATION BY REFERENCE OF MATERIAL SUBMITTED ON A COMPACT DISC

Not applicable.

BACKGROUND OF THE INVENTION

Conventionally, photonic infrared (IR) detectors employ low band gap materials such as InGaAs, InSb, or HgCdTe. However, these materials include elements that are rare, expensive, or toxic. Past research indicates that crystalline Si (c-Si), which is a much cheaper and more abundant element, could be used for IR detection when metal electrodes are properly nanostructured.

In this type of photodetection system, the IR light with energies below the c-Si band gap is strongly absorbed by the metal structures, rather than by c-Si. The photoexcited electrons in the metal can then be injected into the conduction band of c-Si before being thermalized, and electric current can be generated. These non-thermalized electrons, called hot electrons, enable the detection of IR light with energies below the c-Si band gap.

For efficient transport of electrons in the metal before thermalization, the metal layer should be as thin as approximately the electron mean free path. Accordingly, the metal layer thickness should be only a few tens of nanometers. To induce strong optical absorption in such a thin metal layer, surface plasmon polaritons (SPPs) can be excited at the metal surface. Previous studies on hot electron photodetection utilized small-scale metamaterials or deep trench resonators to have strong resonant absorption of SPPs in thin metal films on c-Si at the desired frequencies. However, these structures needed to be fabricated with high precision because the metal structure sizes determine resonances.

Accordingly, in many cases, expensive techniques such as electron beam lithography have been commonly used to fabricate the structures. However, for mass production, it is important to obtain metallic structures that do not require expensive techniques and tolerate practical fabrication errors.

BRIEF SUMMARY OF THE INVENTION

In one embodiment, the present invention provides a photonic infrared detector comprised of at least one metal layer having a broad-band IR absorption of over 85% and a thickness of 10-30 nm, said detector configured to enable light to make a plurality of passes within semiconductor.

In another embodiment, the present invention provides a photonic infrared detector comprising at least one metal metasurface, the surface having a broad-band IR absorption of over 95% in a 15-nm-thick metal film enabled by light taking multiple passes within a c-Si substrate.

In yet another embodiment, the present invention provides a detector wherein light is preferentially absorbed by at least one thin metal layer that is on the top side of the substrate.

In yet another embodiment, the present invention provides a detector wherein absorption on the bottom side is efficiently eliminated by using a dielectric $SiO_2$ layer between a metal back reflector and the Si substrate.

In yet another embodiment, the present invention provides a detector wherein the dielectric layer also electronically passivates the Si surface to reduce the charge carrier recombination.

In yet another embodiment, the present invention provides a detector wherein the top surface of the Si wafer is structured in such a way that admits the incident light into the substrate and prevents the light from leaking out of the substrate.

In yet another embodiment, the present invention provides a detector further including an antireflection coating (ARC) that is applied to the metal structures to reduce reflection at the top surface.

In yet another embodiment, the present invention provides a detector wherein the top surface of an n-type Si substrate is periodically structured with a pitch on the order of a micrometer.

In yet another embodiment, the present invention provides a detector wherein the top surface of the Si substrate is structured to form an array of peaks or peaked structures such as pyramidal dips.

In yet another embodiment, the present invention provides a detector wherein the top surface of the Si substrate is structured to form an array or plurality of peaks which may be in the form of an inverted pyramid array.

In yet another embodiment, the present invention provides a detector wherein a 1-nm-thick titanium (Ti), and a 15-nm-thick gold (Au) layer are sequentially deposited on an n-type Si wafer as an active layer. The Ti layer between the Au and Si layers promotes adhesion between the two layers and prevents the diffusion of Au into Si. The Ti interlayer can be replaced by aluminum, chromium, or gold to modify the Schottky barrier height (SBH) to 0.08, 0.26 or 0.79 eV, respectively.

In yet another embodiment, the present invention provides a detector wherein the SBH at the Si-metal interface is approximately 0.5 eV to allow photons with energies higher than 0.5 eV to be injected into Si to generate electrical currents.

In yet another embodiment, the present invention provides a detector wherein changing the interlayer and the top metal structures modify the IR spectral range of detection.

In yet another embodiment, the present invention provides a detector wherein at the bottom and the side surfaces of the Si wafer, a $SiO_2$ passivation layer is added by thermal oxidation or deposition to minimize the recombination of charge carriers. The bottom $SiO_2$ layer reduces absorption in the bottom metal reflector substantially.

In yet another embodiment, the present invention provides a detector wherein the dielectric layer may be made of various metals, such as aluminum, gold, and silver without a significant difference in absorption in the metal.

In yet another embodiment, the present invention provides a detector wherein the pitch of the structure is shorter than the IR wavelength (~1.5 um) to be detected to allow for multiple diffraction modes.

In yet another embodiment, the present invention provides a detector wherein the peak position and the width of absorption spectrum can be changed by modifying the top surface structure and material.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings generally illustrate, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure, or system. Further, the terms and phrases used herein are not intended to be limiting, but rather to provide an understandable description of the invention.

In one embodiment, the present invention makes use of metal metasurfaces that can be fabricated by scalable, inexpensive techniques and achieve a broad-band IR absorption of over 85% in 15-nm-thick metal films. A preferred thickness in in the range of 10-30 nm. This unprecedented strong absorption, in terms of both the absorptance magnitude and the band width, is enabled by a scheme where the light takes multiple passes within the c-Si substrate.

Figure 1A:
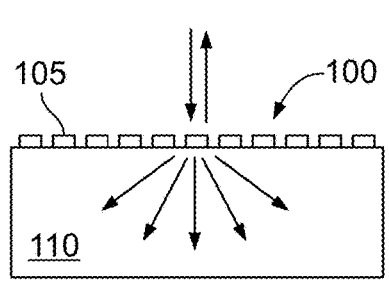
FIG. 1A shows a conventional hot-electron-based IR photodetector device having a single light pass.

FIG. 1A shows a conventional hot-electron-based IR photodetector 100 deploying a scheme where metal nanostructures 105 are placed on an n-type Si substrate 110. In this scheme, the incident light needs to be absorbed in a single pass. Accordingly, highly strong resonances in the metal structures are required, and the structures should be fabricated precisely as designed to excite the resonances.

Figure 1B:
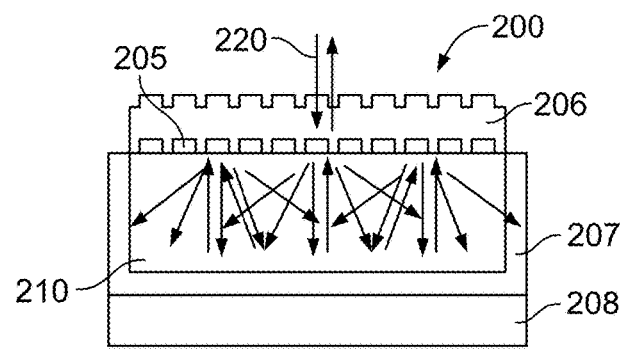
FIG. 1B shows an embodiment of the present invention providing a hot-electron-based IR photodetector device having multiple light passes.
Figure 2:
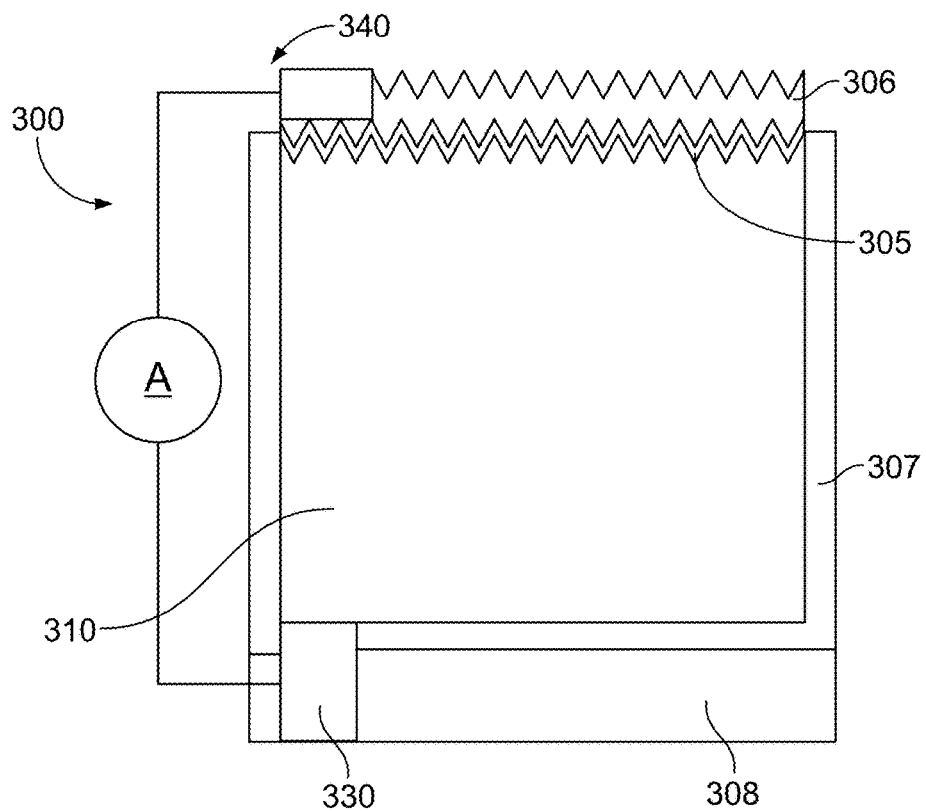
FIG. 2 is a schematic diagram of a hot-electron-based IR photodetector for an embodiment of the present invention.

As shown in FIG. 1B, for an embodiment of the present invention, a hot-electron-based IR photodetector 200 may include metal layer 205, antireflection coating (ARC) 206, passivation layer 207, back reflector 208 and Si substrate 210. Photodetector 200 uses a scheme where light 220 takes multiple passes within the substrate. During the multiple passes, light 220 is preferentially absorbed by the thin metal layer 205 that is on the top side of the substrate. Absorption on the bottom side may be efficiently eliminated by using a dielectric layer 207, which may be $SiO_2$, between metal back reflector 208 and Si substrate 210. Metal back reflector re-directs light toward metal layer 205. Dielectric layer 207 also electronically passivates Si surface 210 to reduce the charge carrier recombination.

Figure 3:
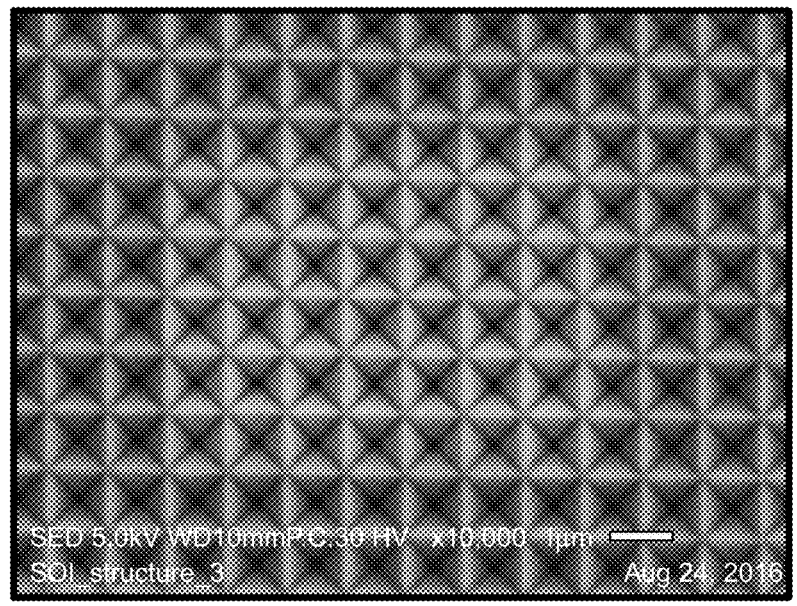
FIG. 3 is an electron micrograph of an inverted pyramid array that may be used with an embodiment of the present invention.

As shown in FIG. 3, for yet another embodiment of the present invention, a hot-electron-based IR photodetector 300 may include metal layer 305, antireflection coating 306, passivation layer 307, back reflector 308 and Si substrate 310. The top surface of the Si wafer is structured to admit incident light into the substrate and prevent light from leaking out of the substrate. To reduce reflection at the top surface, an antireflection coating 306, which may be $Si_3N_4$, can be applied on the metal structures 305. Because light is absorbed during multiple passes by being substantially confined in the c-Si substrate, the metal structures or layer 305 does not have to be fabricated with a very high precision.

The top surface or layer 305 may be periodically structured with a pitch on the order of a micrometer. Layer 305 may also be comprised of a 1-nm-thick titanium (Ti) layer and a 15-nm-thick gold (Au) layer that are sequentially deposited on an n-type Si wafer as an active layer. The Ti layer between the Au and Si layers promotes adhesion between the two layers and prevents the diffusion of Au into Si. The Schottky barrier height (SBH) at the Si-metal interface is approximately 0.5 eV. Thus, for this embodiment, photons with energies higher than 0.5 eV can be injected into the c-Si substrate to generate electrical currents.

The Ti interlayer can be replaced by aluminum, chromium, or gold to modify the SBH to 0.08, 0.26 or 0.79 eV, respectively. By changing the interlayer and the top metal structures, the present invention is able to modify the IR spectral range of detection. At the bottom and the side surfaces of the Si wafer, a $SiO_2$ passivation layer 307 may be added by thermal oxidation or deposition to minimize the recombination of charge carriers. The bottom $SiO_2$ layer 307 reduces absorption in the bottom metal reflector substantially. Thus, with the dielectric layer, various metals, such as aluminum, gold, and silver, can be used for the back reflector without a significant difference in absorption in the metal.

In another embodiment, the present invention may use Al for good adhesion to the $SiO_2$ layer. An Ohmic contact 330 may be made at the bottom by depositing a metal on a portion of the n-Si substrate where the $SiO_2$ passivation layer is absent. A top electrode 340 may also be provided. The contact may be Al.

In yet another embodiment of the present invention, indium (In) may be soldered on the Si surface to create the Ohmic contact. An Ohmic contact may also be made by heavily doping impurities at the contact interface.

In yet another embodiment, as shown in FIG. 3, the top surface of the Si substrate is structured to form an array of dips that form an array or plurality of peaks. In a preferred embodiment, the present invention uses pyramidal dips to create the peaks. The structure, known as an inverted pyramid array, is fabricated by using a lithography followed by alkaline etching. The pitch of the array is 1 micron. An electron micrograph of the fabricated inverted pyramid array is shown in FIG. 3.

Figure 4:
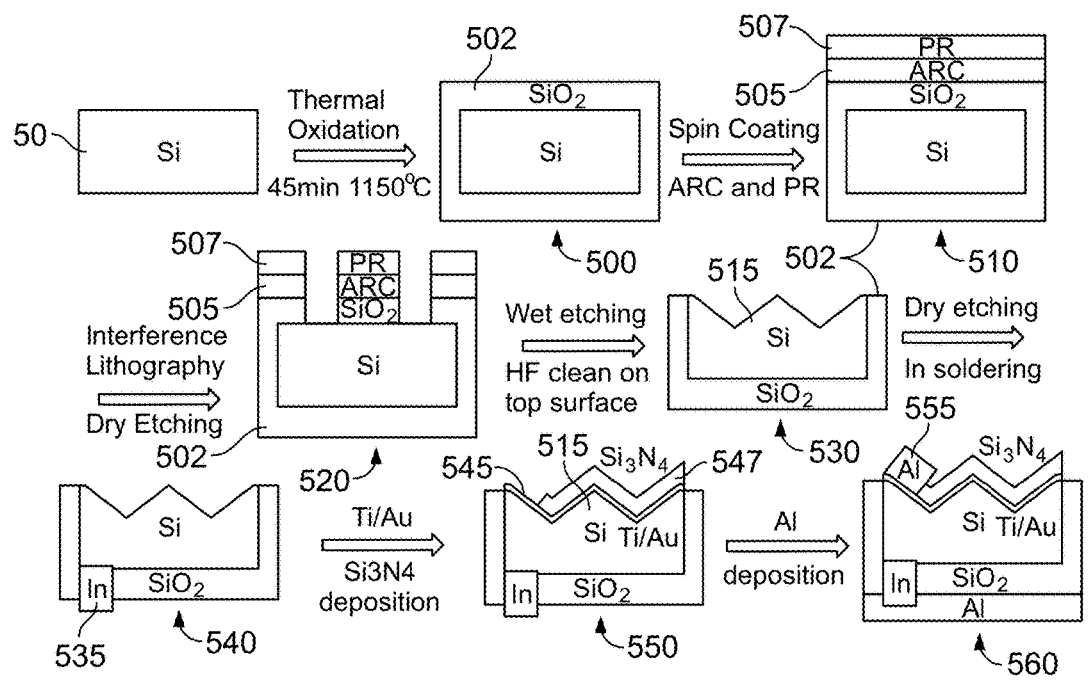
FIG. 4 illustrates a process flow for the fabrication of a hot-electron-based IR photodetector of an embodiment of the present invention.

FIG. 4 shows a process flow for the fabrication the hot-electron-based IR photodetectors of the present invention. The first step 500 is to thermally oxidize a Si wafer 501 to make a passivation layer 502. An ARC layer 505 and a photoresist (PR) 507 layer is deposited on the top surface as step 510. Interference lithography is used to make a square lattice pattern in the PR in step 520. Wet etching in an alkaline solution defines the inverted pyramid array 515 in step 530. At the bottom surface, the Si surface is exposed over a part of the area to create an opening using hydrofluoric acid (HF) in step 540. At the exposed area, In is soldered to make an Ohmic contact 535. Ti/Au 545 is deposited on the surface of the inverted pyramid array 515. Subsequently, a $Si_3N_4$ layer is deposited on the metal surface with a thickness of 135 nm for antireflection in step 550. Over an area where the $Si_3N_4$ deposition is blocked, Al is deposited as a top contact 555 in step 560.

Figure 5:
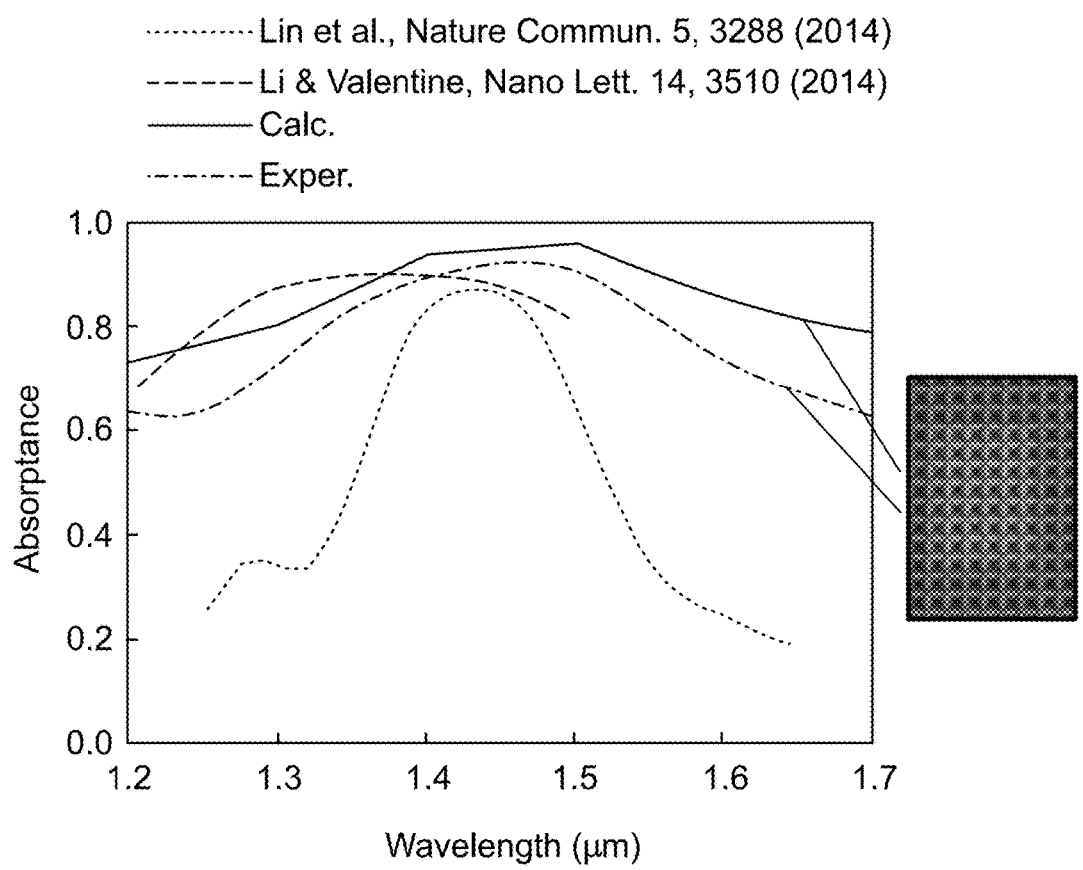
FIG. 5 compares the obtained absorption spectrum in the top metal layer of the present invention to that of the state-of-the-art hot-electron-based structures.

The absorption in the top Ti/Au layer is calculated by tracking the passage of each diffracted light mode within the device. Because the IR wavelength (~1.5 m) is longer than the pitch of the structure, multiple diffraction modes are possible. The calculated absorptance, transmittance and reflectance of each mode at the top layer when the light is incident from the Si side are 44-54%, 0.5-7.9%, and 37-55%, respectively, for a single pass. For the light incident from the air side on the top structure, only ~1% of incident light is reflected at the top surface when a single pass is considered. The optical response of the bottom $SiO_2$/Al reflector when the light is incident from the Si side was also calculated. Based on the calculated values for a single pass, the absorption in the top metal structure that is 15 nm thick for multiple light passes was obtained. FIG. 5 compares the obtained absorption spectrum in the top metal layer of the present invention to that of the state-of-the-art hot-electron-based structures. The absorption of the embodiments of the present invention providing multiple pass devices that surpass that of the state-of-the-art devices in terms of both the level of absorption and the absorption peak width. The peak position and the width of absorption spectrum can be changed by modifying the top surface structure and material. In this case, the SBH is adjusted by a different material system to suit the absorption band.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A photonic infrared detector comprising:
   At least one metal layer having a broad-band IR absorption of over 85% and a thickness of 10-30 nm, said detector configured to enable light to make a plurality of passes within a semiconductor;
   said semiconductor is a c-Si substrate and said at least one metal layer is located on a top side of said c-Si substrate; and
   wherein the top surface of the c-Si substrate is periodically structured with a predetermined pitch.

2. The detector of claim 1, wherein a dielectric is opposingly located from said metal layer, said dielectric reduces absorption on a bottom side of the detector.

3. The detector of claim 1, wherein a dielectric is opposingly located from said metal layer, said dielectric is located between a metal back reflector and the c-Si substrate, said dielectric reduces absorption on the bottom side of a detector.

4. The detector of claim 1 wherein said dielectric is $SiO_2$.

5. The detector of claim 4 wherein said dielectric electronically passivates a bottom and one or more side surface(s) of the c-Si substrate to reduce charge carrier recombinations.

6. The detector of claim 1 wherein said metal layer is configured to admit incident light into the c-Si substrate and prevent light from leaking out of the c-Si substrate.

7. The detector of claim 1 said metal layer has thereon an antireflection coating that reduces reflection at the top surface.

8. The detector of claim 1 wherein the top surface of the c-Si substrate is structured to form an array of pyramidal dips.

9. The detector of claim 1 wherein the top surface of the the c-Si substrate is structured to form an array of peaks.

10. The detector of claim 1 wherein the top surface of the c-Si substrate is periodically structured with a pitch on the order of a micrometer.

11. The detector of claim 1 further including a metal interface between said c-Si substrate and said metal layer, a Schottky barrier height at said metal interface is approximately 0.5 eV to allow photons with energies higher than 0.5 eV to be injected into said c-Si substrate to generate electrical currents.

12. The detector of claim 11 wherein said metal layer interface is aluminum, chromium, or gold to modify the Schottky barrier height to 0.08, 0.26 or 0.79 eV, respectively.

13. The detector of claim 12 further including an active layer.

14. The detector of claim 1 wherein the pitch of the structure is shorter than an IR wavelength to be detected to allow for multiple diffraction modes.

15. A photonic infrared detector comprising:
   at least one metal layer having a broad-band IR absorption of over 85% and a thickness of 10-30 nm, said detector configured to enable light to make a plurality of passe within a semiconductor, and wherein said metal layer is comprised of a 1-nm-thick titanium interface layer and a 15-nm-thick gold active layer.

16. A method of creating a plurality of light passes in a photonic infrared detector comprising the steps of:
   providing a detector comprised of a c-Si substrate having a structured top surface, bottom surface and side surfaces;
   said side and bottom surfaces having a passivation layer;
   said bottom surface further including a back reflector;
   said structured top surface configured in an array of inverted pyramids having a pitch that is less than a wavelength of IR to be detected;

said structured top surface having an interface layer thereon;

an active layer on said interface layer;

an antireflection layer on said active layer; and incident light passes through said structured top surface and is absorbed by said active layer or is transmitted into said substrate and reflected towards said active layer for absorption by said back reflector.

* * * * *